United States Patent
Lin et al.

[11] Patent Number: 6,083,790
[45] Date of Patent: Jul. 4, 2000

[54] METHOD FOR MAKING Y-SHAPED MULTI-FIN STACKED CAPACITORS FOR DYNAMIC RANDOM ACCESS MEMORY CELLS

[75] Inventors: Yo-Sheng Lin, Nantou; Hsien-Tsung Liu, Hsin-Chu, both of Taiwan

[73] Assignee: Taiwan Semiconductor Manufacturing Company Ltd., Hsin-Chu, Taiwan

[21] Appl. No.: 09/248,728

[22] Filed: Feb. 11, 1999

[51] Int. Cl.$^7$ ........................................ H01L 21/70
[52] U.S. Cl. ....................... 438/256; 438/244; 438/253; 438/387; 438/396; 438/399; 257/308
[58] Field of Search .................................. 438/244, 253, 438/256, 387, 396, 399; 257/308

[56] References Cited

U.S. PATENT DOCUMENTS

| | | | |
|---|---|---|---|
| 5,128,273 | 7/1992 | Ema | 438/253 |
| 5,288,655 | 2/1994 | Higasitani et al. | 438/396 |
| 5,567,639 | 10/1996 | Chang | 437/52 |
| 5,622,882 | 4/1997 | Yee | 438/210 |
| 5,650,647 | 7/1997 | Taguchi et al. | 257/308 |
| 5,688,709 | 11/1997 | Rostoker | 437/52 |
| 5,688,712 | 11/1997 | Ema et al. | 438/241 |
| 5,705,420 | 1/1998 | Ema | 437/52 |
| 5,716,884 | 2/1998 | Hsue et al. | 438/254 |
| 5,843,829 | 11/1995 | Kuramae et al. | 438/396 |
| 5,874,332 | 7/1996 | Ema | 438/239 |
| 5,902,123 | 10/1997 | Hsu | 438/253 |

*Primary Examiner*—Donald L. Monin, Jr.
*Assistant Examiner*—Hoai Pham
*Attorney, Agent, or Firm*—George O. Saile; Stephen B. Ackerman

[57] ABSTRACT

An array of DRAM cells having Y-shaped multi-fin stacked capacitors with increased capacitance is achieved. A planar first insulating layer is formed over the semi-conductor devices on the substrate. Polycide bit lines are formed on the first insulating layer, and a second insulating layer and a silicon nitride ($Si_3N_4$) etch-stop layer are conformally deposited. A multilayer, composed of a alternating insulating and polysilicon layers, is conformally deposited over the bit lines. Capacitor node contact openings are etched in the multilayer and in the underlying layers to the substrate. A fourth polysilicon layer is deposited sufficiently thick to fill the node contact openings and to form the node contacts. The multilayer is then patterned to leave portions over the node contacts, and an isotropic etch is used to remove the insulating layers exposed in the sidewalls of the patterned multilayer to provide Y-shaped multi-fin capacitor bottom electrodes over the bit lines. These Y-shaped multi-fin capacitors increase the capacitance by 37% over T-shaped multi-fin capacitors. The DRAM capacitors are then completed by forming an interelectrode dielectric layer on the bottom electrodes and by depositing a fifth polysilicon layer to form the capacitor top electrodes.

24 Claims, 4 Drawing Sheets

METHOD FOR MAKING Y-SHAPED MULTI-FIN STACKED CAPACITORS FOR DYNAMIC RANDOM ACCESS MEMORY CELLS

BACKGROUND OF THE INVENTION

(1) FIELD OF THE INVENTION

The present invention relates to semiconductor integrated circuits, and more particularly to a method for fabricating an array of dynamic random access memory (DRAM) cells with Y-shaped stacked capacitors to increase the capacitance while maintaining a high density of memory cells.

(2) DESCRIPTION OF THE PRIOR ART

Dynamic random access memory (DRAM) circuits (devices) are used extensively in the electronics industry, and more particularly in the computer industry for storing data in binary form (1 and 0) as charge on a storage capacitor. These DRAM devices are made on semiconductor substrates (or wafers) and then the substrates are diced to form the individual DRAM circuits (or chips). Each DRAM circuit (chip) consists in part of an array of individual memory cells that store binary data (bits) as electrical charge on the storage capacitors. Further, the information is stored and retrieved from the storage capacitors by means of switching on or off a single access transistor (via word lines) in each memory cell using peripheral address circuits, while the charge stored on the capacitors is sensed via bit lines and by read/write circuits formed on the peripheral circuits of the DRAM chip.

The access transistor for the DRAM device is usually a field effect transistor (FET), and the single capacitor in each cell is either formed in the semiconductor substrate as a trench capacitor, or is built over the FET in the cell area as a stacked capacitor. To maintain a reasonable DRAM chip size and improved circuit performance, it is necessary to further reduce the area occupied by the individual cells on the DRAM chip. Unfortunately, as the cell size decreases, it becomes increasing more difficult to fabricate stacked or trench storage capacitors with sufficient capacitance to store the necessary charge to provide an acceptable signal-to-noise level for the read circuits (sense amplifiers) to detect. The reduced charge also requires more frequent refresh cycles that periodically restore the charge on these volatile storage cells. This increase in refresh cycles further reduces the performance (speed) of the DRAM circuit.

Since the capacitor area is limited to the cell size in order to accommodate the multitude of cells on the DRAM chip, it is necessary to explore alternative methods for increasing the capacitance without increasing the lateral area that the capacitor occupies on the substrate surface. In recent years the method of choice is to build stacked capacitors over the access transistors within each cell area, rather than forming trench capacitors that need to be etched to increasing depths in the substrate to maintain the necessary capacitance. The stacked capacitors also provide increased latitude in capacitor design and processing while reducing cell area. More specifically, the stacked capacitors can be extended in the vertical direction (third dimension) to increase the stacked capacitor area, and therefore to increase the capacitance.

Numerous methods of making DRAM circuits using stacked capacitors have been reported in the literature. One method of making multi-fin stacked capacitors having increased capacitance is described by Hsue et al., U.S. Pat. No. 5,716,884. The method uses alternating layers of two different insulating materials that are used as a template to form multi-fin polysilicon capacitors over the gate electrodes and the field oxide areas for capacitor-under-bit line (CUB) DRAMs. Another approach for making CUB multi-fin stacked capacitors is described by Chang, U.S. Pat. No. 5,567,639, in which the multi-fins are formed over the gate electrodes (word lines) and over the field oxide. Still another approach is taught by Rostoker in U.S. Pat. No. 5,688,709, in which a composite trench-fin capacitor is formed to increase capacitance. The trench is etched in the node contact area, and the fin-shaped portion of the capacitor is formed over the gate electrodes and over the field oxide areas for a CUB DRAM. Ema, U.S. Pat. No. 5,705,420, forms a Y-shaped multi-fin capacitor over the word lines to increase the capacitance on a CUB DRAM device.

Although there has been considerable work done to increase the capacitance area on these miniature stacked capacitors, it is still desirable to further improve on these capacitors while maintaining a simple process to minimize the number of masking steps.

SUMMARY OF THE INVENTION

A principal object of the present invention is to fabricate capacitor-over-bit line (COB) DRAM cells with Y-shaped stacked capacitors having increased capacitance.

Another object of this invention is to utilize the bit lines for making the Y-shaped stacked capacitors.

Still another object of this invention is to fabricate these Y-shaped stacked capacitors using only two photoresist masks: one photoresist mask for etching node contacts, and a second photoresist mask for defining the Y-shaped multi-fin capacitor bottom electrodes, and therefore providing a cost-effective manufacturing process.

The method for making Y-shaped multi-fin stacked capacitors with increased capacitance for a DRAM device begins by providing a semiconductor substrate. Typically the substrate is a single-crystal silicon substrate doped with a P type conductive dopant, such as boron (B). A relatively thick Field OXide (FOX) is formed surrounding and electrically isolating device areas on the substrate. The field oxide is typically formed using the LOCal Oxidation of Silicon (LOCOS) method, in which a patterned silicon nitride ($Si_3N_4$) layer is used to mask the device areas from oxidation while the silicon substrate in the FOX areas is thermally oxidized to the desired thickness. Other field oxide isolations can also be used, such as shallow trench isolation (STI) and the like. A thin gate oxide is then formed in the device areas of the silicon substrate for making semiconductor devices such as field effect transistors (FETs). Typically a polycide (polysilicon/silicide) layer, having a cap oxide thereon, is patterned to form the FET gate electrodes and the interconnecting word lines for the array of memory cells on the DRAM device. After forming lightly doped source/drain regions adjacent to the FET gate electrodes using ion implantation, a spacer silicon oxide ($SiO_2$) layer is deposited and anisotropically etched back to form spacers on the sidewalls of the gate electrodes. The source/drain contact regions are formed next in the device areas adjacent to the insulating sidewall spacers by a second ion implantation. One source/drain contact area is used for the capacitor node contact and a second source/drain contact area is used for the bit-line contact in each of the memory cell areas.

Continuing, a first insulating layer is deposited over the device areas and the FOX areas. The first insulating layer is composed of silicon oxide ($SiO_2$) and is deposited by low-pressure chemical vapor deposition (LPCVD). The first insulating layer is then planarized, for example by chemical/mechanical polishing (CMP). A first polysilicon layer is deposited on the planar first insulating layer, and is N⁺ conductively doped with phosphorus, for example by ion implantation. A refractory metal silicide layer, such as tungsten silicide, is deposited on the first polysilicon layer to form a polycide layer. The polycide layer is then patterned to form an array of bit lines for the memory cells on the DRAM devices. A conformal $SiO_2$ second insulating layer and a conformal silicon nitride ($Si_3N_4$) etch-stop layer are deposited over the bit lines. A multilayer layer of alternating layers of insulating layers and doped polysilicon layers is then conformally deposited over the bit lines. More specifically, the multilayer is composed of a $SiO_2$ third insulating layer, an N⁺ doped second polysilicon layer, a $SiO_2$ fourth insulating layer, an N⁺ doped third polysilicon layer, and a $SiO_2$ fifth insulating layer. Using a first photoresist mask, capacitor node contact openings are anisotropically etched in the multilayer, in the $Si_3N_4$ etch-stop layer, and in the $SiO_2$ second and first insulating layers to one of the two source/drain contact areas in each memory cell area on the substrate. An N⁺ fourth polysilicon layer is deposited by low-pressure chemical vapor deposition (LPCVD) and is sufficiently thick to fill the capacitor node contact openings and to provide additional strength for the bottom electrodes for the Y-shaped multi-fin capacitor structure. The fourth polysilicon layer is preferably doped in situ with phosphorus during deposition. Using a second photoresist mask, the fourth polysilicon layer and the multilayer are patterned to the etch-stop layer to define the array of Y-shaped multi-fin bottom electrodes over the node contacts. An important feature of this invention is that the conformality of the multilayer over the bit lines results in Y-shaped multi-fin bottom electrodes that substantially increase the capacitance over T-shaped capacitor bottom electrodes that would be formed on a planar surface. The third, fourth, and fifth insulating layers exposed in the sidewalls of the patterned multilayer are removed using an isotropic etch in a hydrofluoric acid solution. This results in free-standing, Y-shaped multi-fin bottom electrodes over the bit lines. The array of stacked capacitors is now completed by forming a thin interelectrode dielectric layer having a high dielectric constant on the bottom electrodes. For example, the dielectric layer can be composed of a $SiO_2/Si_3N_4/SiO_2$ layer (ONO) or other high dielectric constant material such as tantalum pentoxide ($TaO_5$) and the like. A conformal, in-situ doped fifth polysilicon layer is deposited, for example by LPCVD, and is patterned to form the top electrodes to complete the array of dynamic random access memory (DRAM) cells having these Y-shaped multi-fin stacked capacitors having increased capacitance. The Y-shaped multi-fin structure has larger surface area than more traditional T-shaped multi-fin structures for the same area occupied by the capacitor on the memory cell. For example, a Y-shaped three-fin structure has a 37 percent increase in capacitance over a T-shaped three-fin capacitor.

BRIEF DESCRIPTION OF THE DRAWINGS

The objects and advantages of this invention are best understood with reference to the attached drawings in FIGS. 1 through 9, and the embodiment that follows.

DESCRIPTION OF THE PREFERRED EMBODIMENT

The method for making the DRAM cells having these improved Y-shaped multi-fin stacked capacitors is now described in detail. However, it should also be well understood by one skilled in the art that by including additional process steps, in addition to those described in this embodiment, other types of devices can also be included on the DRAM chip. For example, by forming N-well regions in a P doped substrate, P-channel FETs can also be provided from which Complementary Metal-Oxide-Semiconductor (CMOS) circuits can also be formed, such as are used for the peripheral circuits on the DRAM chip.

Figure 1:
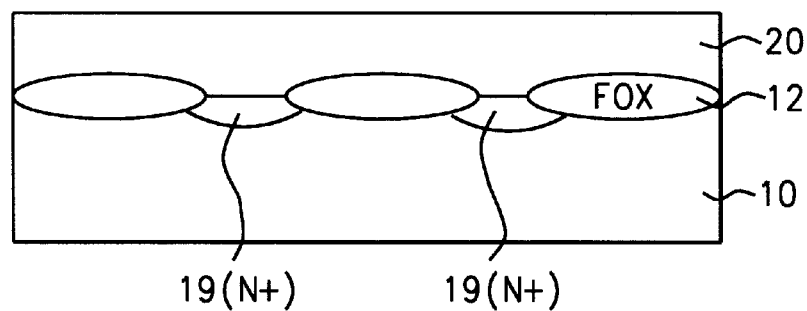
FIGS. 1 through 9 show schematic cross-sectional views for one of the memory cell regions of a DRAM cell illustrating in detail the fabrication steps for making the Y-shaped multi-fin stacked storage capacitor by the method of this invention.

Referring now to FIG. 1, a schematic cross-sectional view of a portion of a semiconductor substrate 10 is shown having a partially completed DRAM cell. The preferred substrate 10 is composed of a lightly doped P type single-crystal silicon having a <100> crystallographic orientation. A relatively thick Field OXide (FOX) 12 is formed to surround and electrically isolate the individual device regions in which the memory cells are built. The field oxide 12, which is only partially shown in FIG. 1, is most commonly formed by the LOCal Oxidation of Silicon (LOCOS) method. Briefly the LOCOS method uses a thin $SiO_2$ (pad oxide) as a stress release layer, and a thicker silicon nitride ($Si_3N_4$) layer that serves as an oxidation barrier layer on the pad oxide on the substrate surface (not shown in FIG. 1). Also not depicted in the drawings, conventional photolithographic techniques and etching are used to remove the $Si_3N_4$ barrier layer in areas where a field oxide is required, while retaining the $Si_3N_4$ over the active device areas to prevent oxidation. The silicon substrate is then thermally oxidized to form the field oxide areas 12, as shown in FIG. 1. The field oxide is usually grown to a thickness of between about 3000 and 6000 Angstroms, and the $Si_3N_4$ barrier layer and pad oxide are removed in a wet etch. For example, the nitride can be removed in a hot phosphoric acid ($H_3PO_4$) etch, and the pad oxide can be removed in a dilute solution of hydrofluoric acid and water ($HF/H_2O$). Other field oxide isolation methods can be used which allow even more closely spaced device areas and higher cell density. For example shallow trench isolation (STI) and the like can be used with this invention.

Although not shown in FIG. 1, the next sequence of process steps is used to make an array of access transistors (N-channel FETs) in the active device regions. Briefly, the surface of the silicon substrate 10 in the device areas is thermally oxidized to form a thin gate oxide for the N-channel FET. An electrically conducting layer (not shown), which can have a cap oxide (not shown), is deposited and patterned to form the FET gate electrodes over the device areas, and which also forms the interconnecting word lines (not shown) over the field oxide for the DRAM cells. After forming FET lightly doped source/drain areas by ion implantation, followed by forming sidewall spacers on the gate electrodes, a second ion implantation is used to form the source/drain contact areas for the bit line contacts and for the capacitor node contacts. Only the cross section through the source/drain contact area 19(N⁺) for the capacitor node contact is depicted in FIG. 1.

Continuing with FIG. 1, a first insulating layer 20, commonly referred to as an interpolysilicon oxide-1 (IPO-1), is deposited over the device areas and the field oxide areas 12. Preferably the first insulating layer is composed of silicon oxide ($SiO_2$). For example, layer 20 can be deposited by low-pressure chemical vapor deposition (LPCVD), and is deposited to a thickness of between about 2000 and 6000 Angstroms. The first insulating layer 20 is then planarized. One method of globally planarizing layer 20 is to use chemical/mechanical polishing (CMP) using an appropriate polishing slurry. Alternatively, a low-temperature glass, such as borophosphosilicate glass (BPSG) can be used as the first insulating layer that is locally planarized by thermal annealing.

Figure 2:
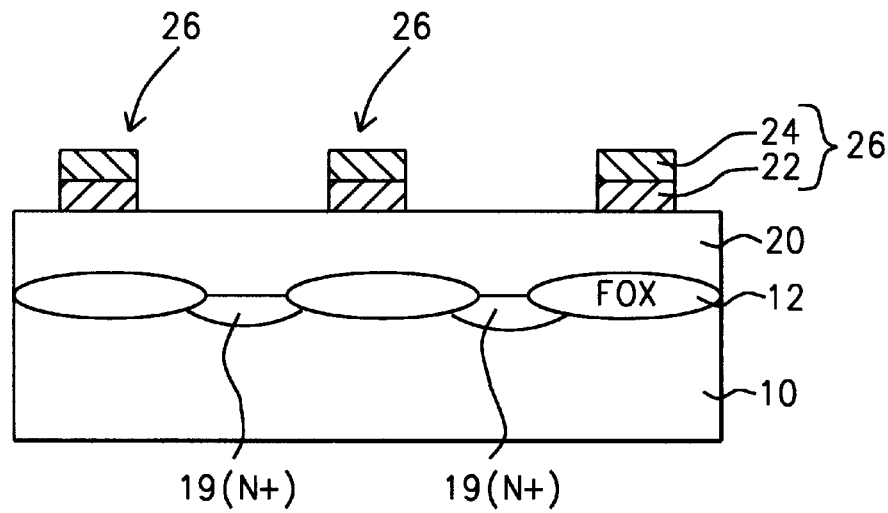

Referring to FIG. 2, a first polysilicon layer 22 is deposited on the planar first insulating layer 20. Polysilicon layer 22 is deposited by LPCVD using a reactant gas such as silane ($SiH_4$), and is deposited to a thickness of between about 250 and 800 Angstroms. Layer 22 is then $N^+$ conductively doped with phosphorus, for example by ion implantation. The final dopant concentration of layer 22 is between about 1.0 E 19 and 1.0 E 21 atoms/cm$^3$. Alternatively, layer 22 can be doped in situ by adding a dopant gas such as phosphine ($PH_3$) during the polysilicon deposition. Next, a refractory metal silicide layer 24, such as tungsten silicide, is deposited on the first polysilicon layer 22 to form a polycide layer 26. The tungsten silicide is preferably deposited by LPCVD using a reactant gas mixture such as tungsten hexafluoride ($WF_6$) and $SiH_4$. The silicide layer 24 is deposited to a preferred thickness of between about 600 and 1800 Angstroms.

An array of bit lines for the DRAM devices is now formed by patterning the polycide layer 26 using conventional photolithographic techniques and anisotropic plasma etching, as shown in FIG. 2 for three of the bit lines, also labeled 26. For example, the anisotropic plasma etching can be carried out in a high-density plasma (HDP) etcher or reactive ion etcher (RIE) using an etchant gas mixture such as chlorine and hydrogen bromide ($Cl_2$/HBr).

Figure 3:
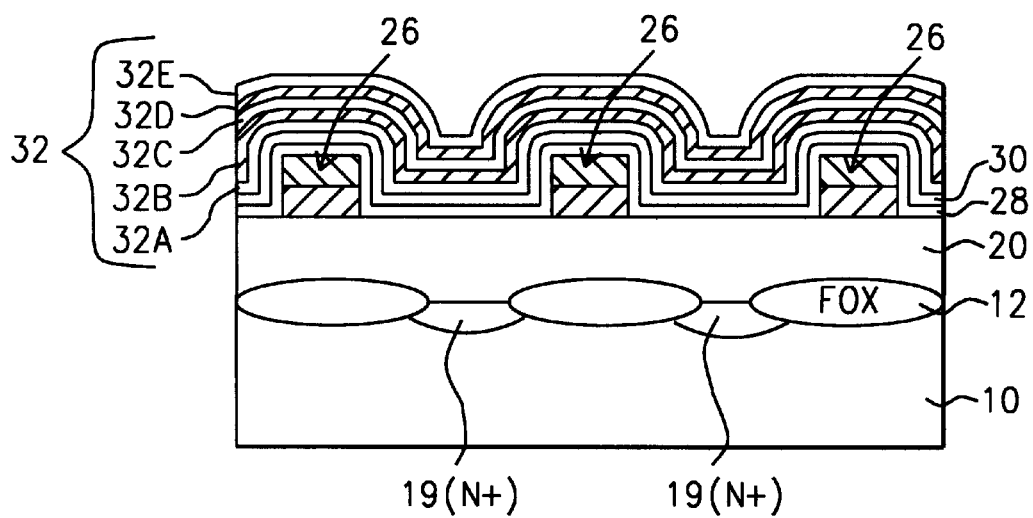

Referring now to FIG. 3, a relatively thin second insulating layer 28 is deposited conformally over the bit lines 26. Layer 28 is preferably $SiO_2$ and is deposited by LPCVD using tetraethosiloxane (TEOS) and ozone ($O_3$) as the reactant gas mixture, and is deposited to a thickness of between about 1500 and 4500 Angstroms. Next, an etch-stop layer 30 is conformally deposited over the oxide layer 28 on the bit lines 26. Etch-stop layer 30 is preferably composed of silicon nitride ($Si_3N_4$) and is deposited by LPCVD using dichlorosilane ($SiCl_2H_2$) and ammonia ($NH_3$). The etch-stop layer 30 is deposited to a preferred thickness of between about 150 and 400 Angstroms.

Still referring to FIG. 3, a multilayer 32 consisting of alternating layer of insulating layers and doped polysilicon layers is conformally deposited over the bit lines 26. The number of polysilicon layers in the multilayer 32 determines the number of fins in the capacitor bottom electrodes. The conformality of the multilayer 32 will eventually result in a Y-shaped multi-fin capacitor with increased capacitance over a more traditional T-shaped multi-fin capacitor having the same number of fins. For the purpose of this invention, a three-fin structure is described. As shown in FIG. 3, the multilayer is composed of a $SiO_2$ third insulating layer 32A, an $N^+$ doped second polysilicon layer 32B, a $SiO_2$ fourth insulating layer 32C, an $N^+$ doped third polysilicon layer 32D, and a $SiO_2$ fifth insulating layer 32E. The $SiO_2$ insulating layers 32A, 32C, and 32E are deposited by LPCVD using, for example, TEOS, and are deposited to a preferred thickness of between about 300 and 1000 Angstroms. The $N^+$ doped polysilicon layers 32B and 32D are deposited by LPCVD using $SiH_4$ as the reactant gas, and are in-situ doped during deposition by adding $PH_3$ as the dopant gas. The preferred thickness of polysilicon layers 32B and 32D is between about 300 and 1000 Angstroms.

Figure 4:
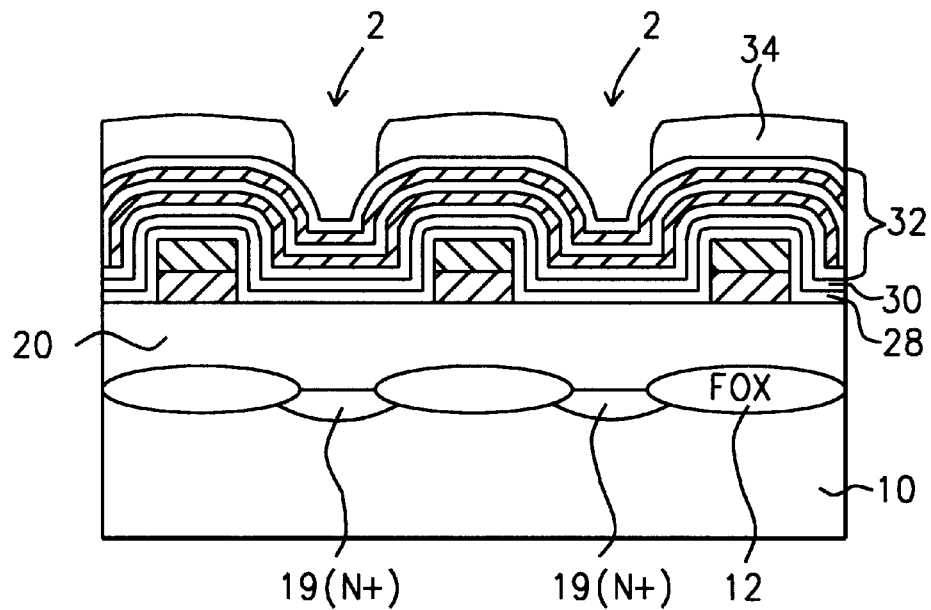

Referring now to FIG. 4, a first photoresist etch mask 34 is patterned to etch contact openings 2 for capacitor node contacts.

Figure 5:
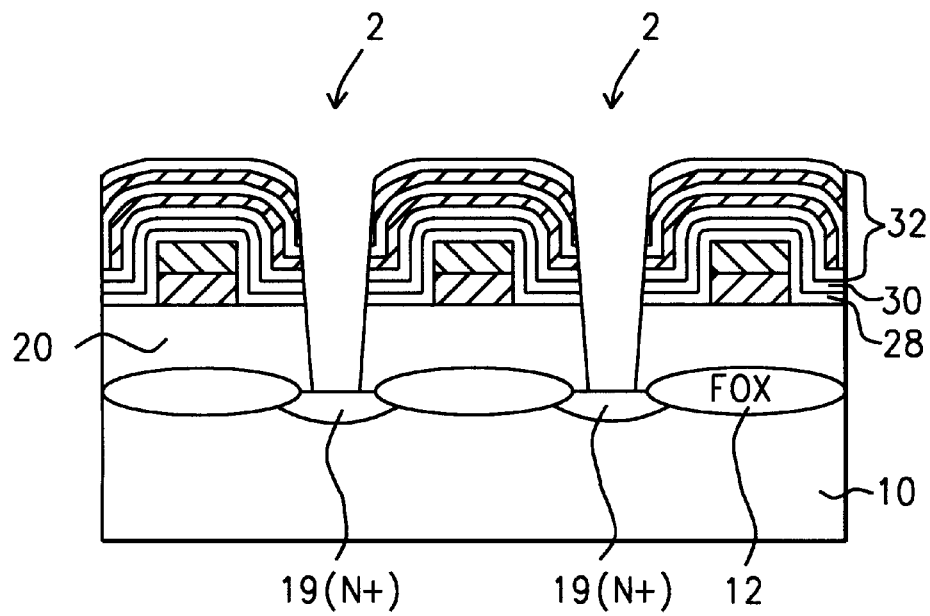

As shown in FIG. 5, the capacitor node contact openings 2 are anisotropically etched in the multilayer 32, in the $Si_3N_4$ etch-stop layer 30, and in the $SiO_2$ second insulating layer 28, and in the $SiO_2$ first insulating layer 20 to one of the two source/drain contact areas 19($N^+$) in each memory cell area on the substrate. The etching is preferably carried out in a HDP etcher or RIE using an etchant gas mixture such as trifluoromethane, carbon tetrafluoride, argon, and nitrogen ($CHF_3$/$CF_4$/Ar/$N_2$) having proportions of about 9:3:8:2.5 which are achieved by adjusting the flow rates of the gases into the etching chamber. The etching gas mixture is changed to $CHF_3$/$CF_4$, having a flow rate ratio of about 9:1, to selectively etch the $SiO_2$ first insulating layer 20 to the silicon substrate 10.

Figure 6:
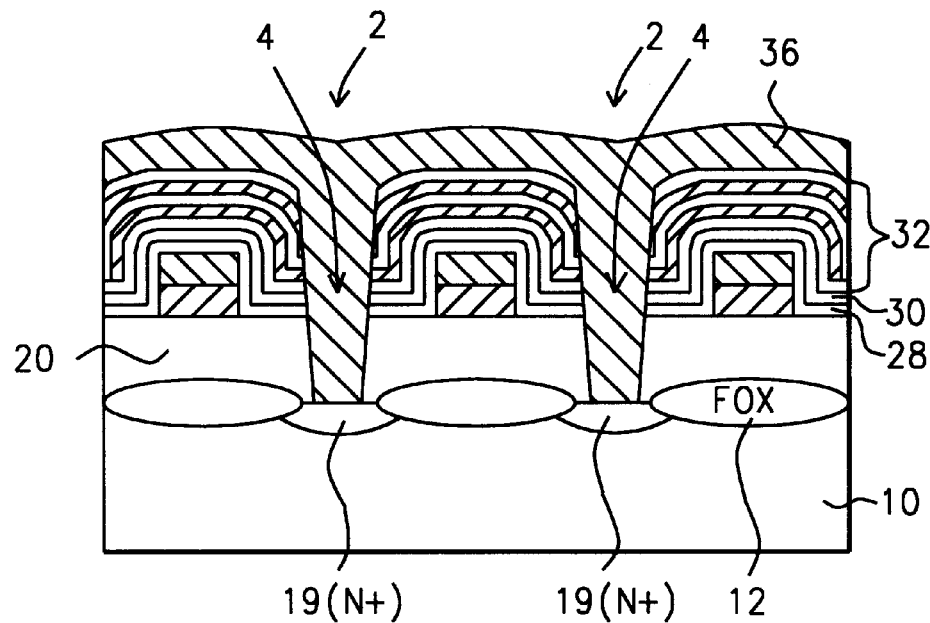

Referring to FIG. 6, after removing the photoresist mask 34, an $N^+$ fourth polysilicon layer 36 is conformally deposited by LPCVD using $SiH_4$ as the reactant gas, and is in-situ doped during deposition using $PH_3$ as the dopant gas. The fourth polysilicon layer 36 is deposited sufficiently thick to fill the capacitor node contact openings 2 to form node contacts 4, and to provide additional strength for the bottom electrodes for the Y-shaped multi-fin capacitor structure. For example, if the node contact openings 2 have a width that is about 0.3 micrometers (um), then the fourth polysilicon layer 36 would be deposited to a thickness of at least greater than 1500 Angstroms.

Figure 7:
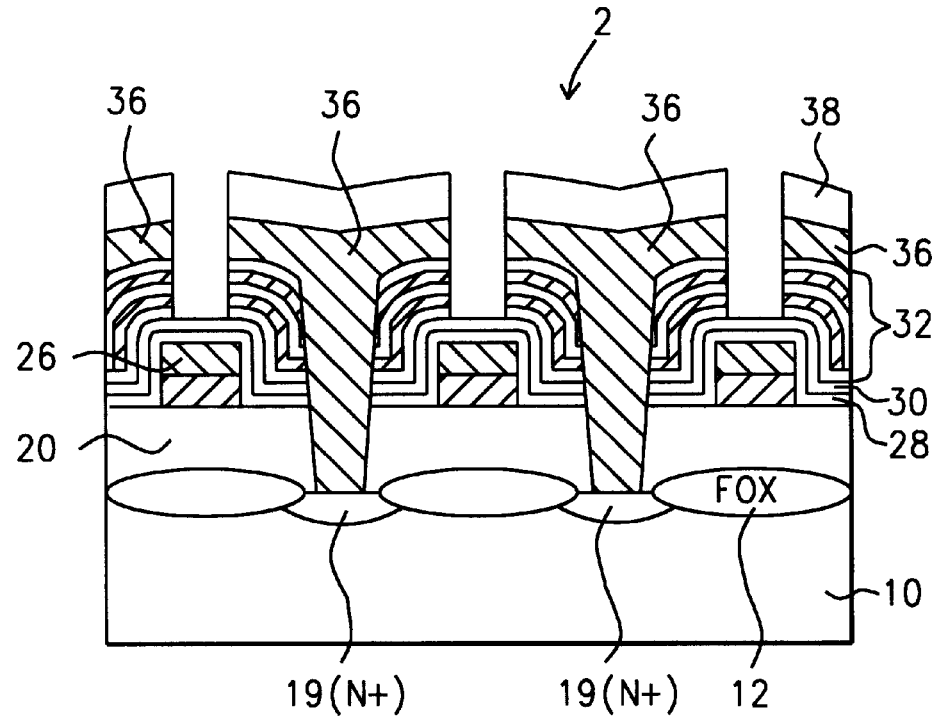

Referring to FIG. 7, a second photoresist mask 38 and anisotropic plasma etching are used to pattern the fourth polysilicon layer 36 and the multilayer 32 to the etch-stop layer 30 to define the array of Y-shaped multi-fin bottom electrodes aligned over the node contacts 4. The anisotropic plasma etching is carried out using a HDP etcher and an etchant gas mixture such as HBr/$Cl_2$/$C_2F_6$. An important feature of this invention is that the multilayer is conformal over the bit lines and results in Y-shaped multi-fin bottom electrodes that substantially increases the capacitance compared to T-shaped capacitor bottom electrodes that would be formed on a planar insulating surface over the bit lines.

Figure 8:
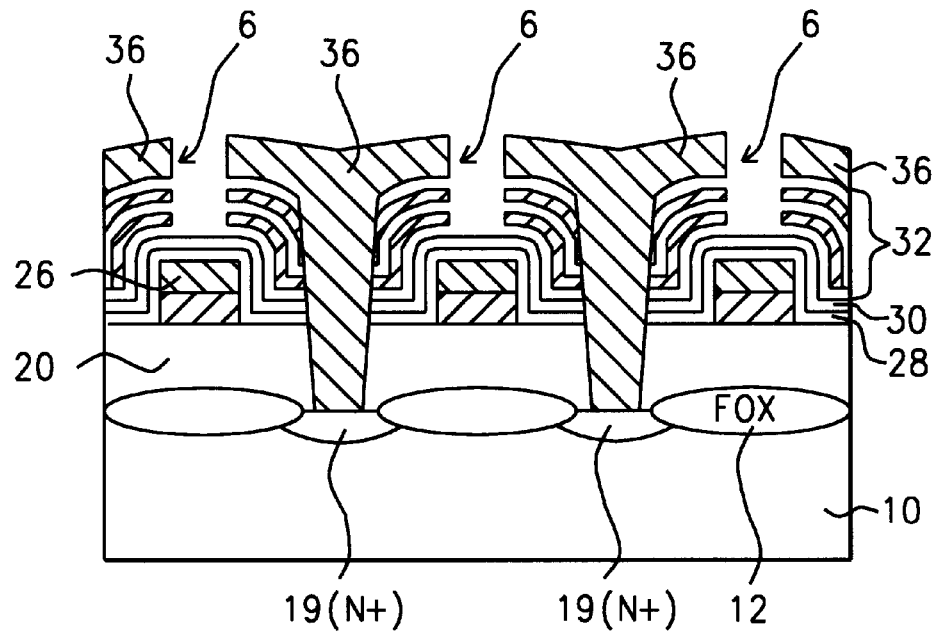

Referring to FIG. 8, the second photoresist mask is removed, for example, by plasma ashing in oxygen. Then the third, fourth, and fifth insulating layers (32A, 32C, and 32E) exposed in the sidewalls 6 of the patterned multi-layer 32 are removed using an isotropic etch in a hydrofluoric (HF) acid solution. This results in free-standing, Y-shaped multi-fin bottom electrodes over the bit lines 26. The underlying $SiO_2$ insulating layers 28 and 20 that electrically insulate the semiconductor devices (not shown) are protected from etching by the $Si_3N_4$ etch-stop layer 30.

Figure 9:
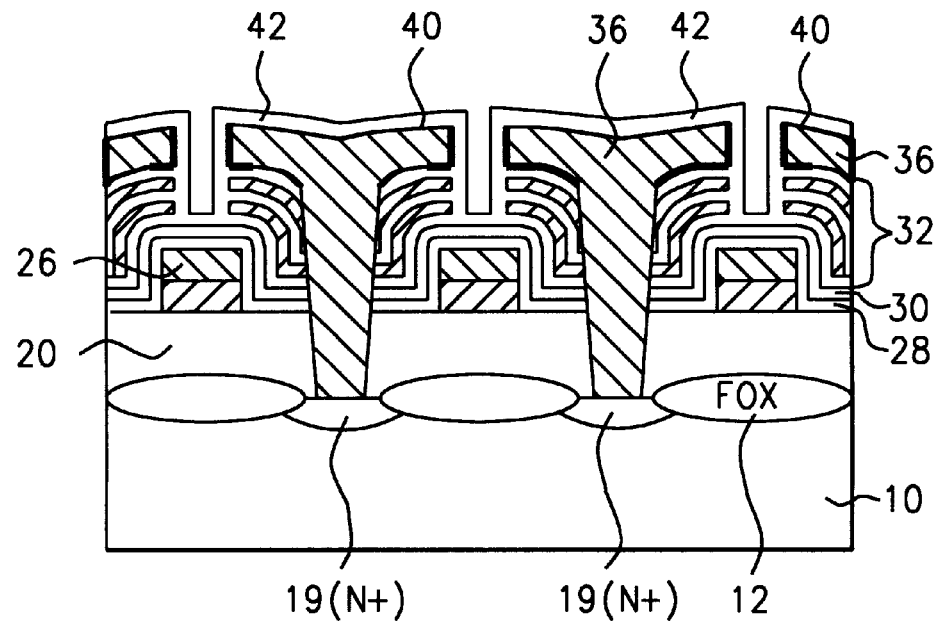

Referring now to FIG. 9, a thin interelectrode dielectric layer 40, that has a high dielectric constant, is deposited on the array of bottom electrode. The dielectric layer 40 is preferably composed of layers of $SiO_2$/$Si_3N_4$/$SiO_2$ (ONO). The ONO dielectric layer can be formed by growing a thermal oxide on the polysilicon bottom electrodes 36, depositing a $Si_3N_4$ layer by LPCVD, and then using an oxidation furnace to partially reduce the $Si_3N_4$ layer to form a top $SiO_2$ layer. Preferably the ONO is formed to a thickness of between about 25 and 75 Angstroms. Alternatively, the dielectric layer 40 can be other high dielectric constant materials, such as tantalum pentoxide ($Ta_2O_5$) or can be used in conjunction with ONO to form the high-dielectric-constant layer 40.

Continuing with FIG. 9, the array of Y-shaped stacked capacitors is completed by depositing a conformal, in-situ doped fifth polysilicon layer 42. The fifth polysilicon layer 42 is deposited, for example by LPCVD using a reactant gas such $SiH_4$, and using a dopant gas such as $PH_3$. The fifth polysilicon layer 42 is doped $N^+$ to a preferred concentration of between about 1.0 E 19 and 1.0 E 21 atoms/cm³. The preferred thickness of the fifth polysilicon layer 42 is between about 500 and 1500 Angstroms. The fifth polysilicon layer is then patterned to form the top electrodes.

EXAMPLE

To better appreciate this invention, DRAM cells were fabricated on silicon wafers using the above processing steps to make the Y-shaped three-fin stacked capacitors having increased capacitance, and control wafers were processed to make the T-shaped three-fin stacked capacitors. The capacitance was measured on the Y-shaped capacitors and on the T-shaped capacitors using a capacitance meter, Model 490-8AU, manufactured by MDC Company of U.S.A.

The following Table shows the comparison of the capacitance measured on the Y-shaped three-fin capacitors of this invention with the T-shaped three-fin capacitors. The measurements were made on 52 test sites across the wafers, and the mean value of the capacitance is shown in the Table below for both the Y-shaped and T-shaped capacitors.

TABLE

|  | Y-Shaped Structure | | T-Shaped Structure | |
| --- | --- | --- | --- | --- |
| Wafer ID | 1 | 2 | 3 | 4 |
| Thickness ONO (Angstroms) | 41.2 | 41.4 | 41.7 | 41.5 |
| Capacitance (fF)/Cell | 43.6 | 43.4 | 31.7 | 31.7 |

Row 1 shows the wafer identification number, row 2 shows the thickness of the interelectrode dielectric layer, and row 3 shows the measured capacitance in femtoFarads (fF). As can be seen from the Table, the capacitance of wafers 1 and 2 for the Y-shaped three-fin capacitor structure is 43.6 and 43.4 fF, respectively, compared to the T-shaped three-fin capacitor structure which is 31.7 fF for wafers 3 and 4. The Y-shaped three-fin capacitor results in an increase in capacitance of about 37 percent.

While the invention has been particularly shown and described with reference to the preferred embodiment thereof, it will be understood by those skilled in the art that various changes in form and details may be made without departing from the spirit and scope of the invention.

What is claimed is:

1. A method for fabricating an array of Y-shaped multi-fin stacked capacitors on dynamic random access memory (DRAM) devices comprising the steps of:

providing a semiconductor substrate having field oxide areas surrounding device areas and said device areas having semiconductor devices;

depositing a first insulating layer over said device areas and said field oxide areas;

planarizing said first insulating layer;

depositing a first polysilicon layer on said planar first insulating layer;

depositing a refractory metal silicide layer on said first polysilicon layer to form a polycide layer;

patterning said polycide layer to form bit lines for memory cells of said DRAM devices;

depositing a conformal second insulating layer and a conformal etch-stop layer over said bit lines;

conformally depositing a multilayer composed of a third insulating layer, a second polysilicon layer, a fourth insulating layer, a third polysilicon layer, and a fifth insulating layer over said bit lines;

etching capacitor node contact openings in said multilayer, in said etch-stop layer, in said second insulating layer, and in said first insulating layer to said device areas on said substrate;

depositing a fourth polysilicon layer sufficiently thick to fill said capacitor node contact openings;

patterning said fourth polysilicon layer and said multilayer to said etch-stop layer for forming Y-shaped multi-fin bottom electrodes for said stacked capacitors conforming to said bit lines;

isotropically etching said third, fourth, and fifth insulating layers exposed in sidewalls of said patterned multilayer to provide free-standing said Y-shaped multi-fin bottom electrodes, resulting from said conformal multilayer over said bit lines;

forming an interelectrode dielectric layer on said bottom electrodes;

depositing and patterning a fifth polysilicon layer to form top electrodes thereby completing said array of Y-shaped multi-fin stacked capacitors for said DRAM devices.

2. The method of claim 1, wherein said first insulating layer is composed of silicon oxide and has a thickness of between about 2000 and 6000 Angstroms.

3. The method of claim 1, wherein said first polysilicon layer is conductively doped and is deposited to a thickness of between about 300 and 900 Angstroms.

4. The method of claim 1, wherein said refractory metal silicide layer is tungsten silicide and has a thickness of between about 600 and 1800 Angstroms.

5. The method of claim 1, wherein said second insulating layer is silicon oxide and is deposited to a thickness of between about 1500 and 4500 Angstroms.

6. The method of claim 1, wherein said etch-stop layer is silicon nitride and is deposited to a thickness of between about 150 and 400 Angstroms.

7. The method of claim 1, wherein said third, fourth, and fifth insulating layers are silicon oxide and each of said insulating layers is deposited to a thickness of between about 300 and 1000 Angstroms.

8. The method of claim 1, wherein said second and third polysilicon layers are conductively doped and each of said polysilicon layers is deposited to a thickness of between about 300 and 1000 Angstroms.

9. The method of claim 1, wherein said fourth polysilicon layer is deposited to a thickness of at least greater than 1500 Angstroms.

10. The method of claim 1, wherein said isotropic etching of said third, fourth, and fifth insulating layers is carried out in a hydrofluoric acid etch, while said etch-stop layer protects said second insulating layer from etching.

11. The method of claim 1, wherein said interelectrode dielectric layer is composed of silicon oxide/silicon nitride/silicon oxide (ONO) and has a thickness of between about 25 and 75 Angstroms.

12. The method of claim 1, wherein said fifth polysilicon layer is conductively doped and is deposited to a thickness of between about 500 and 1500 Angstroms.

13. A method for fabricating an array of Y-shaped multi-fin stacked capacitors on dynamic random access memory (DRAM) devices comprising the steps of:

providing a semiconductor substrate having field oxide areas surrounding device areas and said device areas having semiconductor devices;

depositing a first insulating layer over said device areas and said field oxide areas;

planarizing said first insulating layer;

depositing a first polysilicon layer on said planar first insulating layer;

depositing a refractory metal silicide layer on said first polysilicon layer to form a polycide layer;

patterning said polycide layer to form bit lines for memory cells of said DRAM devices;

depositing a conformal second insulating layer and a conformal silicon nitride etch-stop layer over said bit lines;

conformally depositing a multilayer composed of a third insulating layer, a second polysilicon layer, a fourth insulating layer, a third polysilicon layer, and a fifth insulating layer over said bit lines;

etching capacitor node contact openings in said multilayer, in said etch-stop layer, in said second insulating layer, and in said first insulating layer to said device areas on said substrate;

depositing a fourth polysilicon layer sufficiently thick to fill said capacitor node contact openings;

patterning said fourth polysilicon layer and said multilayer to said etch-stop layer for forming Y-shaped multi-fin bottom electrodes for said stacked capacitors conforming to said bit lines;

isotropically etching said third, fourth, and fifth insulating layers exposed in sidewalls of said patterned multilayer to provide free-standing said Y-shaped multi-fin bottom electrodes, resulting from said conformal multilayer over said bit lines;

forming an interelectrode dielectric layer on said bottom electrodes;

depositing and patterning a fifth polysilicon layer to form top electrodes thereby completing said array of Y-shaped multi-fin stacked capacitors for said DRAM devices.

14. The method of claim 13, wherein said first insulating layer is composed of silicon oxide and has a thickness of between about 2000 and 6000 Angstroms.

15. The method of claim 13, wherein said first polysilicon layer is conductively doped and is deposited to a thickness of between about 300 and 900 Angstroms.

16. The method of claim 13, wherein said refractory metal silicide layer is tungsten silicide and has a thickness of between about 600 and 1800 Angstroms.

17. The method of claim 13, wherein said second insulating layer is silicon oxide and is deposited to a thickness of between about 1500 and 4500 Angstroms.

18. The method of claim 13, wherein said silicon nitride etch-stop layer is deposited to a thickness of between about 150 and 400 Angstroms.

19. The method of claim 13, wherein said third, fourth, and fifth insulating layers are silicon oxide and each of said insulating layers is deposited to a thickness of between about 300 and 1000 Angstroms.

20. The method of claim 13, wherein said second and third polysilicon layers are conductively doped and each of said polysilicon layers is deposited to a thickness of between about 300 and 1000 Angstroms.

21. The method of claim 13, wherein said fourth polysilicon layer is deposited to a thickness of at least greater than 1500 Angstroms.

22. The method of claim 13, wherein said isotropic etching of said third, fourth, and fifth insulating layers is carried out in a hydrofluoric acid etch, while said etch-stop layer protects said second insulating layer from etching.

23. The method of claim 13, wherein said inter-electrode dielectric layer is composed of silicon oxide/silicon nitride/silicon oxide (ONO) and has a thickness of between about 25 and 75 Angstroms.

24. The method of claim 13, wherein said fifth polysilicon layer is conductively doped and is deposited to a thickness of between about 500 and 1500 Angstroms.

* * * * *